United States Patent [19]

Nakamura

[11] Patent Number: 5,343,081
[45] Date of Patent: Aug. 30, 1994

[54] SYNAPSE CIRCUIT WHICH UTILIZES BALLISTIC ELECTRON BEAMS IN TWO-DIMENSIONAL ELECTRON GAS

[75] Inventor: Kazuo Nakamura, Tokyo, Japan
[73] Assignee: NEC Corporation, Tokyo, Japan
[21] Appl. No.: 933,118
[22] Filed: Aug. 21, 1992
[30] Foreign Application Priority Data Aug. 23, 1991 [JP] Japan .................................. 3-211271

[51] Int. Cl.⁵ .......................... G06G 7/12; H01J 17/36
[52] U.S. Cl. ...................................... 307/201; 395/24; 315/344; 315/349
[58] Field of Search ..................... 395/24, 27; 313/310; 315/344, 349, 362; 307/201

[56] References Cited

U.S. PATENT DOCUMENTS

| | | | |
|---|---|---|---|
| 4,059,784 | 11/1977 | Perevodchikov et al. | 315/349 |
| 4,594,630 | 6/1986 | Rabinowitz et al. | 313/310 |
| 4,994,709 | 2/1991 | Green et al. | 313/310 |
| 5,163,328 | 11/1992 | Holland et al. | 313/310 |
| 5,204,588 | 4/1993 | Ugajin et al. | 315/349 |

FOREIGN PATENT DOCUMENTS 4-263379 9/1992 Japan .

OTHER PUBLICATIONS

"Electrostatic Electron Lens In The Ballistic Regime", Physical Review B, vol. 41, No. 11, by U. Sivan, et al., Apr. 1990, pp. 7937–7940.

"Noninteracting Beams of Ballistic Two-Dimensional Electrons", Appl. Phys. Lett., vol. 58 (3), by J. Spector, et al., Jan. 1991, pp. 263–265.

*Primary Examiner*—Edward P. Westin
*Assistant Examiner*—Benjamin D. Driscoll
*Attorney, Agent, or Firm*—Burns, Doane, Swecker & Mathis

[57] ABSTRACT

According to the present invention, there is provided a semiconductor synapse circuit comprising a semiconductor having an electrically charged carrier gas which is provided with a plurality of electrically isolated input channels providing narrowed areas 21 through 24 respectively for restricting the emitting direction of the electrically charged carriers from emitter electrodes 11 through 14 as the exit, gate electrodes 31 through 34 for applying an electrostatic potential for changing the traveling direction of the carriers emitted from the input channels, a single narrowed area 41 positioned opposed to the exits 21 through 24 of the input channels for passing through only the carriers traveling in the restricted direction and an acceptor electrode 40 for collecting the carriers which have passed through the single narrowed area.

Since it utilizes the ballistic performance of the carriers, as compared with the conventionally proposed circuit, a synapse circuit whose area is greatly reduced and whose operating speed is improved can be realized. Thus, it becomes possible to further improve the degree of integration and reduce the delay time at the line.

7 Claims, 5 Drawing Sheets

SYNAPSE CIRCUIT WHICH UTILIZES BALLISTIC ELECTRON BEAMS IN TWO-DIMENSIONAL ELECTRON GAS

FIELD OF THE INVENTION

The present invention relates to a semiconductor synapse circuit and a neuron device formed by combining the synapse circuit and a semiconductor circuit or superconductive circuit, which are utilized in forming a neural network.

BACKGROUND OF THE INVENTION

Conventionally, it has been demonstrated that a neural network apparatus formed in order to realize functions similar to those of a biological neural network has excellent data processing functions such as pattern recognition and the like and, in connection with this, various studies have been under way from the points of both hardware and software. In particular, as to the hardware, there have been available one using electric circuit and one using light. Among the former, one in which the biological neural tissue is simulated to prepare a synapse or cell by using silicon MOS, or one in which they are prepared by using a superconductive circuit including Josephson junction has been experimentally made or proposed.

It is true that a neural network can be realized and is considered realizable according to the conventional proposal, but its number of neuron devices is still small. Therefore, in order to allow a practical extensive application, it is necessary to further improve the degree of integration. A problem with this integration is that the number of connections between the devices amounts to a vast one. According to the conventionally proposed ones, the circuit forming the synapse becomes too large and, accordingly, the operation delay time at the synapse portion also becomes great resulting in a large computing time and trouble.

SUMMARY OF THE INVENTION

Accordingly, an object of the present invention is to solve the foregoing problems and to provide a synapse circuit which allows a high-speed operation and the miniaturization by using a mesoscopic ballistic electron.

Another object of the present invention is to provide a semiconductor neuron device which is realized by combining the foregoing synapse circuit and a semiconductor circuit including transistors or to provide a semiconductor-superconductor neuron device which is realized by combining the foregoing synapse circuit and a superconductive circuit including Josephson junctions.

According to the present invention, in order to achieve the foregoing end, there is provided a semiconductor synapse circuit in which a semiconductor having an electrically charged carrier gas is provided with a plurality of input channels each providing a narrowed area for restricting the emitting direction of the carrier as the exit, the input channels being each electrically isolated, electrodes for applying an electrostatic potential which allow the traveling direction of the carrier emitted from the input channel to be changed, a single narrowed area positioned opposed to the exits of the input channels for passing through only the carriers traveling in the restricted direction and an acceptor electrode for collecting the carriers which have passed through the single narrowed area.

According to one embodiment of the present invention, the foregoing narrowed area is formed by evaporating a Schottky metal on the semiconductor at both sides of the area to form a Schottky contact to deplete the carrier present at the semiconductor area below the metal.

In another embodiment of the present invention, the foregoing narrowed area is formed by implanting ions into the semiconductor at both sides of the area to turn into a high resistance or by turning the semiconductor at both sides of the area into a mixed crystal.

Further, according to the present invention, in order to achieve the foregoing end, there is provided a semiconductor neuron device comprising the foregoing semiconductor synapse device and a threshold circuit, the threshold circuit applying a potential difference generated at a resistor present between the acceptor electrode and the ground electrode of the synapse circuit as the control voltage for the gate of its transistor.

Further, according to the present invention, in order to achieve the foregoing end, there is provided a semiconductor-superconductor neuron device comprising the foregoing synapse circuit and the threshold circuit, the threshold circuit carrying out the threshold operation depending on whether the current induced to an inductor coupled to an inductor interposed between the acceptor electrode and the ground electrode of the synapse circuit by a superconductive line is large or not.

The present invention is hereinafter described in detail.

The operations required for the neuron device may be summarized as follows.

(1) operation of weighted addition, that is, synapse operation
(2) threshold operation That is, the inputs from other neuron devices are each weighted and added (1), and if their sum exceeds a certain value, an output is emitted (2).

According to the present invention, the above-described synapse operation (1) is realized by utilizing the conduction of the ballistic carriers in a mesoscopic regime, which has recently been vigorously studied. As reported in Physical Review B, Vol. 41, No. 11, pp 7937 through 7940, 1990, by U. Sivan et al, the ballistic charged carrier emitted from the narrowed area (hereinafter referred to as "point contact"), which restricts the traveling direction of the carrier, can be changed in its traveling direction by the electrostatic potential having a spatial gradient, which may be formed by, for example, a gate electrode attached on the substrate surface. They demonstrated that the electrically charged carriers can be allocated to different acceptors prepared with several point contacts, which serve as the electrically isolated acceptors opposed to a single point contact provided as an emitter, by varying the voltage applied to the gate electrode.

The present invention is based on an original discovery that the traveling direction of the ballistic carrier emitted through a plurality of emitters, that is point contacts, is controlled by the gate electrode each provided in the neighborhood of each exit so that the carriers can be collected to a single acceptor, that is a point contact, disposed opposed to the plural point contacts and that, at this time, the amount of the carriers incident from each emitter to the acceptor corresponds to the voltage applied to each gate electrode and is independent of the amount of the carrier incident from other emitters. This discovery is endorsed by the fact that the distribution of the ballistic carrier emitted from each emitter is directional but within a certain range of width and the amount of the carrier jumping into the acceptor can be continuously changed by each gate voltage and that there is no interference between the carriers jumping into the acceptor from different emitters and the sum rule subsists. As to the latter fact, an experiment endorsing this was carried out by J. Spector et al, which is reported in Appl. Phys. Lett. Vol. 58(3), pp 263 through 265, January, 1991, in which two sets of the emitter and acceptor point contacts were disposed so that the traveling directions of the carriers emitted from the emitter intersected with each other with the result that it was confirmed that the carriers incident into the acceptor for one set and that for the other set did not interfere with each other. The foregoing corresponds to the synapse circuit portion according to the present invention, in which the carriers passing through the point contact of the acceptor are all collected to the ohmic acceptor electrode.

Next, in the present invention, the threshold operation (2) is realized in two different manners.

In the first manner, the transistor, which has been representative of the threshold device, is used. That is, the potential difference generated at the resistor provided between the acceptor electrode and the ground electrode of the synapse circuit portion is applied as the control voltage to the gate of the adjacent transistor. In the second manner, a superconductive threshold device is used including an inductor magnetically coupled to a superconductive line provided between the acceptor electrode and the ground electrode of the synapse circuit portion and a Josephson junction as a switching element. As this superconductive threshold device, one disclosed in Japanese Patent Application No. 3-24224 may be used.

According to the foregoing invention, as compared with the conventionally proposed circuit, a synapse circuit whose area is greatly reduced can be realized. Thus, it becomes possible to further improve the degree of integration and reduce the delay time at the line.

In particular, the device according to the present invention is based on the low temperature operation, and it is easy to use the superconductor for the line, which allows the heat evolution at its bulky wiring portion to be suppressed.

In addition, since it is possible to continuously weight each input, the device can be finely adjusted so that an expected output can precisely be obtained, and its recognition factor can be remarkably increased when, for example, it is applied to the actual pattern recognition.

DESCRIPTION OF THE PREFERRED EMBODIMENTS

Embodiments of the present invention are hereinafter described with reference to the accompanying drawings.

Figure 1:
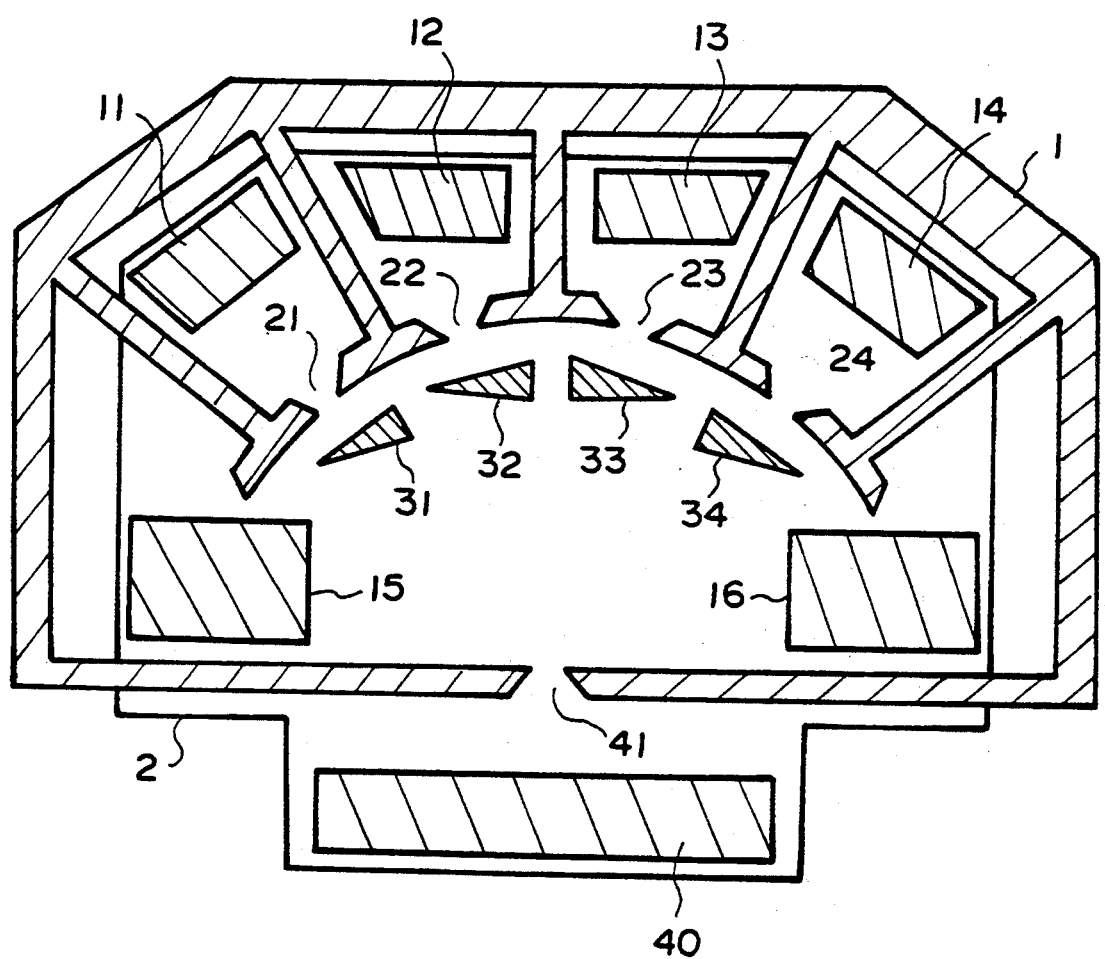
FIG. 1 is a plan view of a first embodiment of the synapse circuit according to the present invention.

FIG. 1 is a plan view illustrating a first embodiment of the synapse circuit according to the present invention. As the semiconductor substrate in which the semiconductor synapse circuit according to the present invention is incorporated, a substrate of high mobility, for example an AlGaAs/GaAs substrate is used so that the ballistic performance of the electrically charged carrier may be utilized. In order to restrict the area where the electrically charged carriers are present, a mesa etching is carried out to form a mesa area 2 while a Schottky electrode, 1 is formed in a predetermined pattern on the substrate surface. As the metallic material for the Schottky electrode, for example, Au/Ti may be used. Formation of the Schottky electrode 1 causes the electrically charged carrier to be depleted at its lower substrate portion.

Reference numerals 11 through 14 each denote an emitter electrode for entering of the carrier from other neuron devices. In this embodiment, for the sake of simplicity, its number is set to four. The narrowed areas designated 21 through 24, which lie forwardly of the emitter electrode, are each a point contact for restricting the traveling direction of the charged carrier flowing out of the emitter electrode. Further, reference numerals 31 through 34 are each a gate electrode for forming the electrostatic potential for changing the traveling direction of the charged carrier jumped out of the emitter area. Reference numeral 41 is a point contact for passing through only the charged carriers collected to this area which lie within a certain range, and the carriers which pass through this point contact are collected to the acceptor electrode 40. Electrodes 15, 16 are each a drain electrode for collecting the charged carriers which could not pass through the point contact 41.

In order to fully display the function of this synapse circuit, it is necessary to finely process so that the distance ranging from the point contacts 21 through 24 at the side of the emitter up to the point contact 41 at the side of the acceptor may lie within the mean free path of the charged carrier to thereby run the carrier ballistically. The mean free path of the charged carrier of the substrate used in this embodiment is about 10 $\mu$m. Therefore, if the distance from the point contacts 21 through 24 up to the point contact 41 is set to, for example, 5 $\mu$m, then the ballistic performance can be fully assured. In addition, the line leading to each emitter electrode, acceptor electrode and each gate electrode is formed the upper layer (not shown).

Figure 2:
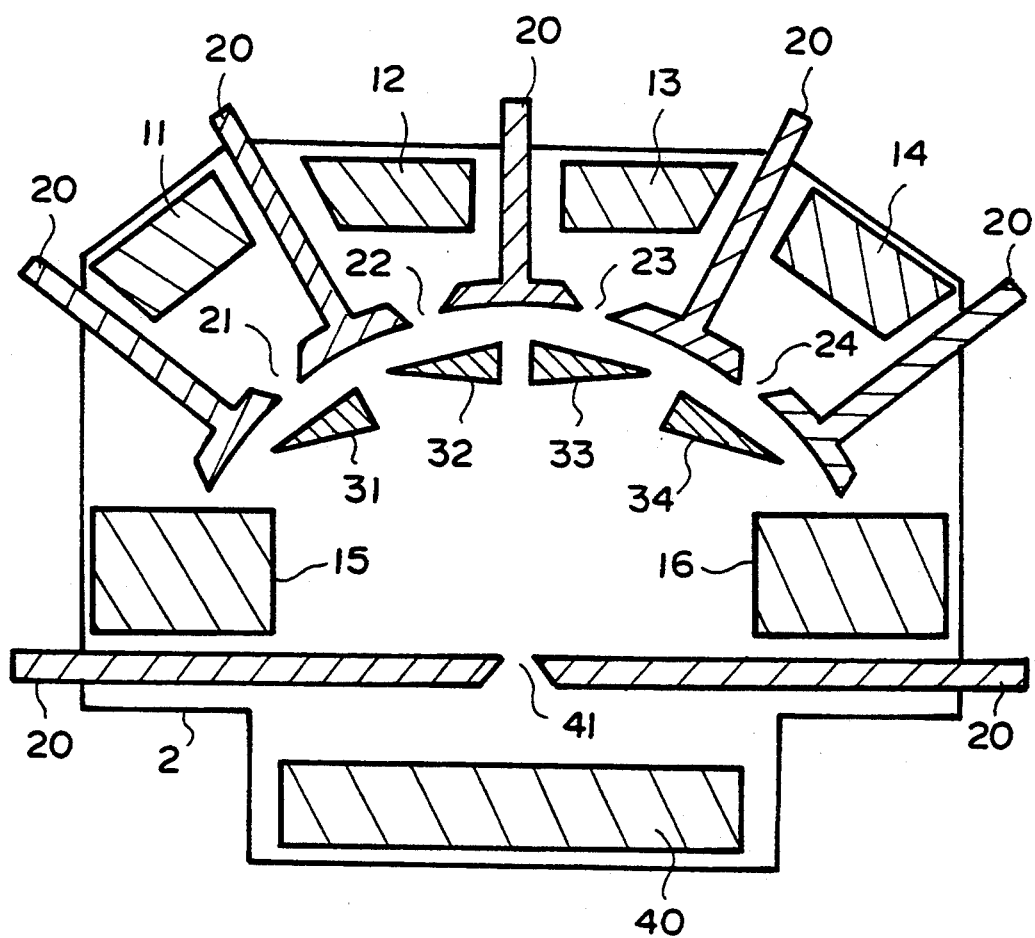
FIG. 2 is a plan view of a second embodiment of the synapse circuit according to the present invention.

FIG. 2 is a plan view illustrating a second embodiment of the synapse circuit according to the present invention. In this figure, like signs are each assigned to like portions as in FIG. 1.

In this embodiment, in order to form the point contacts 21 through 24 and 41, the area 20 is made highly resistant by implanting ions or is turned into a mixed crystal. As the implanted ion, Ga can be enumerated by way of example. For injecting ions, for the sake of convenience, a focused ion beam may be used. In order to turn into the mixed crystal, thermal annealing can be utilized following Ga or Be ion implantation.

Also in this embodiment, the distance between the point contacts 21 through 24 up to the point contact 41 may be set to, for example, 5 μm to fully assure the ballistic performance.

Figure 3:
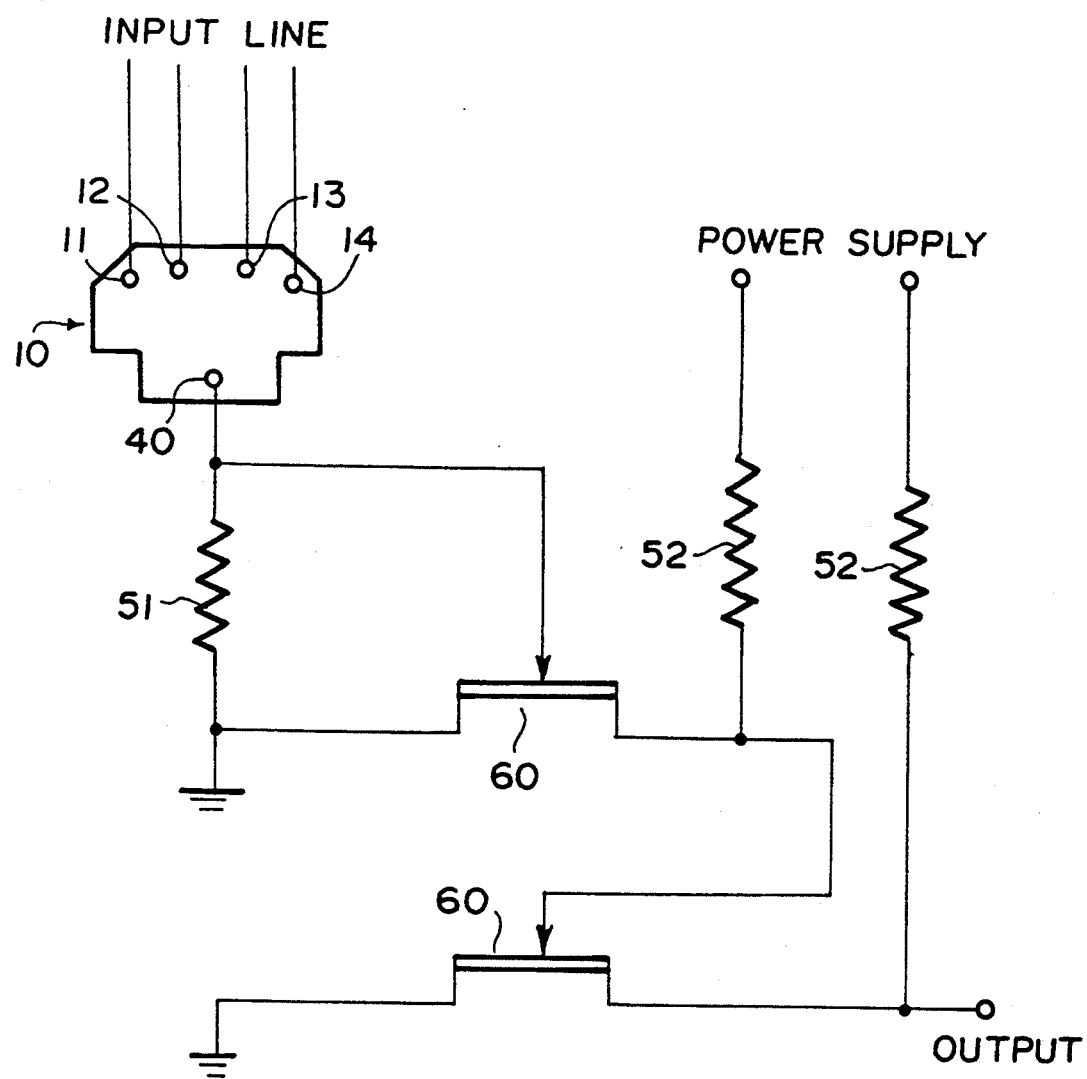
FIG. 3 is a circuit diagram illustrating a first embodiment of a semiconductor neuron device according to the present invention.

FIG. 3 is a circuit diagram illustrating a first embodiment of the semiconductor neuron device according to the present invention, in which the foregoing synapse circuit is used and the transistor is used as the threshold element.

Reference numeral 10 is a synapse circuit as shown in FIGS. 1 and 2, reference numerals 11 through 14 each an emitter electrode at the side of the input of the synapse circuit and reference numeral 40 an acceptor electrode. Acceptor electrode 40 is grounded through resistor 51, and the potential difference generated at both ends of the resistor 51 is entered to the gate of the transistor 60. The main current of the transistor 60 is fed from the power supply via the resistor 52, and the threshold value of the transistor 60 and the resistance value of the resistor 51 are selected so that, depending on whether the current flowing into the acceptor electrode 40 of the synapse circuit 10 is large or small, the main current may be controlled. The output is shunted by an appropriate load to be entered to the synapse circuit of the next stage.

Figure 4:
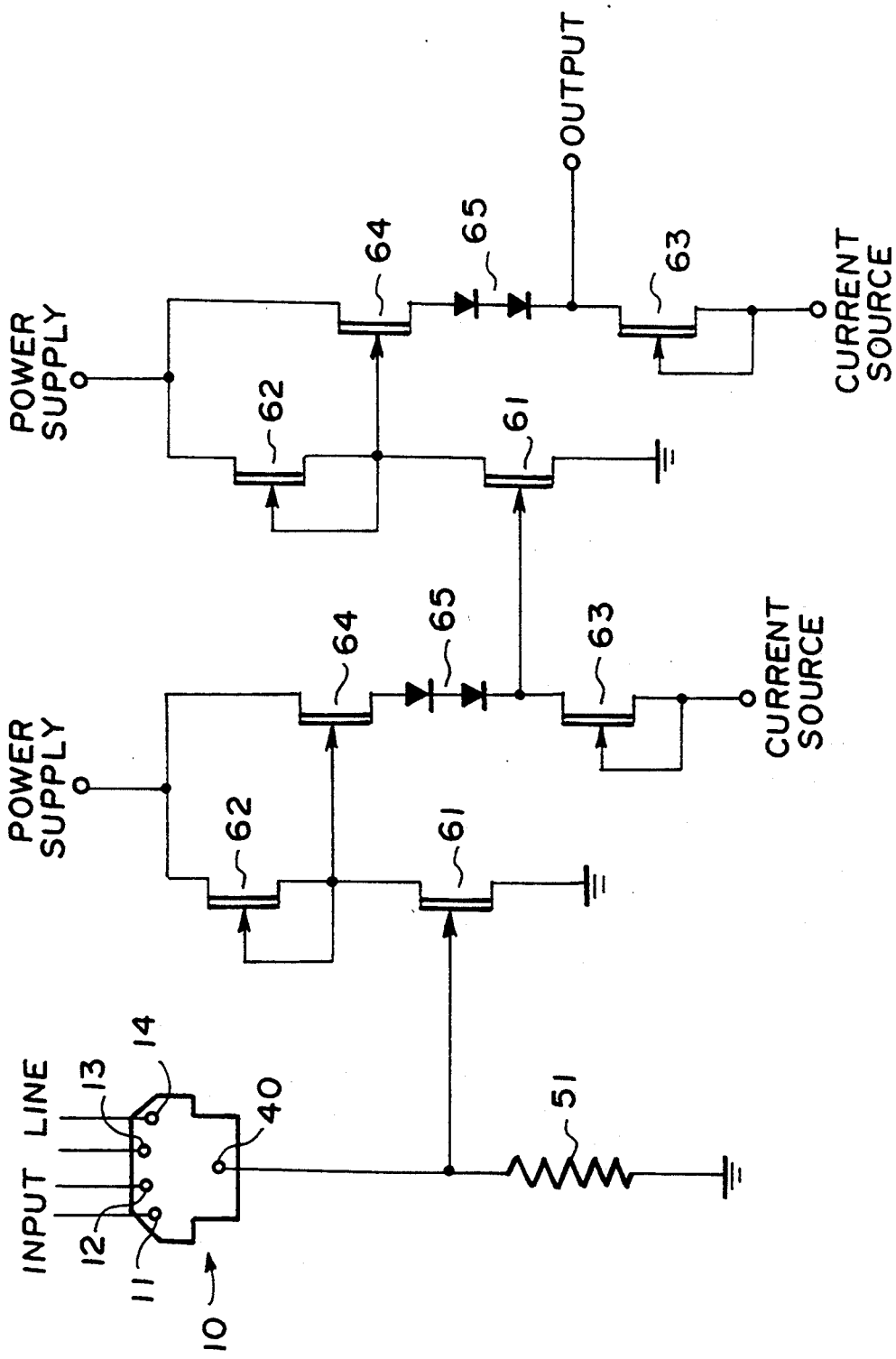
FIG. 4 is a circuit diagram illustrating a second embodiment of the semiconductor neuron device according to the present invention.

FIG. 4 is a circuit diagram illustrating a second embodiment of the semiconductor neuron device according to the present invention, in which the foregoing synapse circuit is used and the transistor is used as the threshold element.

Although, in the first embodiment shown in FIG. 3, the synapse circuit and the semiconductor threshold circuit are directly coupled in order to ease its connection most, in this embodiment, in order to obtain a great fan-out number required for the neuron device, a buffered FET logic circuit is used. Reference numerals 61 through 64 are each a transistor for forming the circuit, and reference numeral 65 a diode. In addition, other than those circuits, a basic logic circuit for GaAs or hereto junction FET such as a source-coupled type FET logic circuit or the like may be used.

Figure 5:
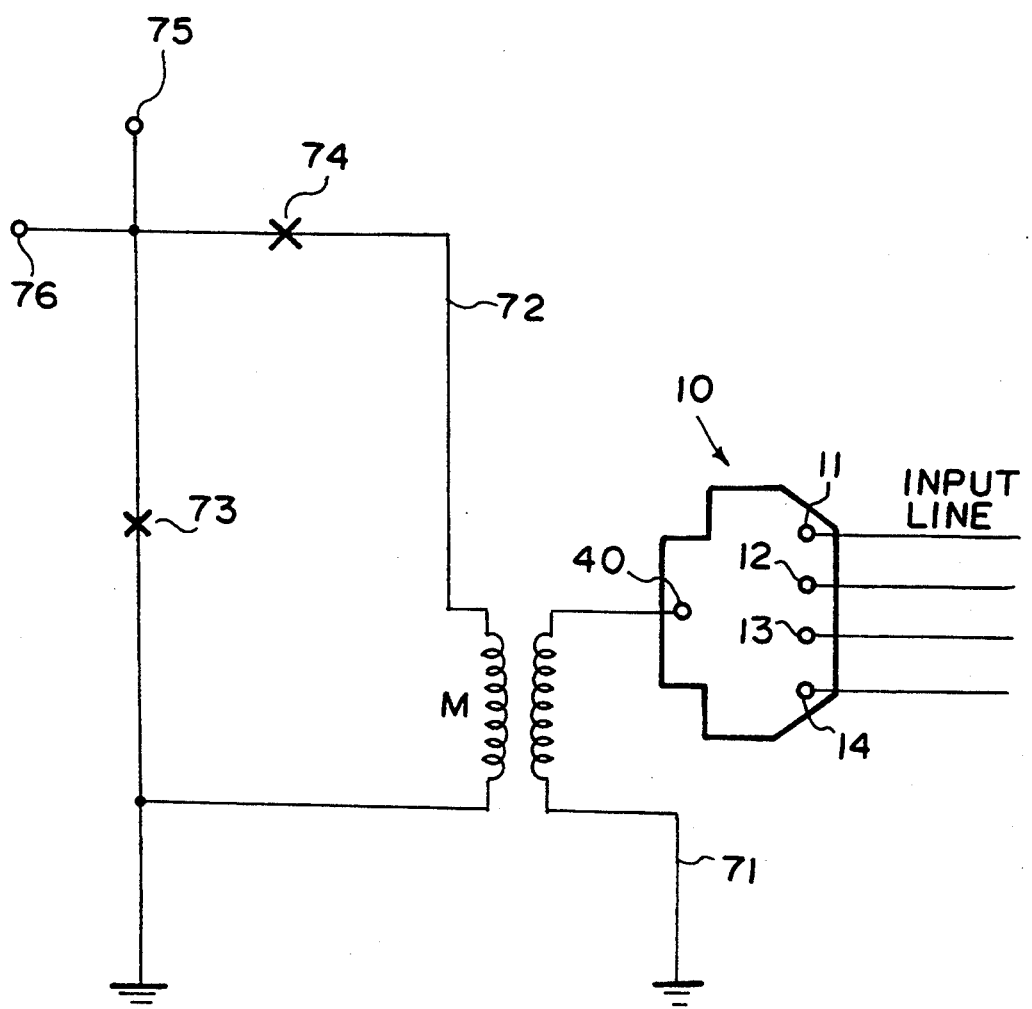
FIG. 5 is a circuit diagram illustrating an embodiment of a semiconductor-superconductor neuron device according to the present invention.

FIG. 5 is a circuit diagram illustrating an embodiment of the semiconductor-superconductor neuron device according to the present invention.

The acceptor electrode 40 of the synapse circuit 10 is grounded via the superconductive line 71, and is magnetically coupled to a superconductive closed circuit 72 by an inductor within this line. Through this superconductive closed circuit, a bias current from the bias current input terminal 75 flows through the Josephson junction 73 while, other than that, a circulating current flows through the superconductive closed circuit 72 according to the current flowing through the superconductive line 71 and a mutual inductance M. If the sum of the bias current and the circulating current exceeds the threshold current of the Josephson junction 73, then this junction is switched to the voltage state, and these currents pass through the Josephson junction 74. Here, if the threshold current of the Josephson junction 74 is made smaller than that of the Josephson junction 73, then the Josephson junction 74 is switched to the voltage state and, in the end, the current is fed out to the output terminal 76.

The present invention is not necessarily restricted to the foregoing embodiments, but various changes and modifications may be made thereto within the scope and spirit of the present invention defined in claims.

What is claimed is:

1. A semiconductor synapse circuit comprising:
   a semiconductor, having an electrically charged carrier gas is, provided with a plurality of input channels each providing a first narrowed area for restricting an emitting direction of the electrically charged carrier, said input channels being each electrically isolated,
   electrodes for applying and electrostatic potential for changing a traveling direction of the carrier emitted from said input channels,
   a single second narrowed area positioned opposed to the first narrowed areas of said plural input channels for passing through only carriers traveling in the restricted emitting direction, and
   an acceptor electrode for collecting the carriers passing through said single second narrowed area.

2. A semiconductor neuron device comprising:
   a synapse circuit including a semiconductor having an electrically charged carrier gas, which is provided with a plurality of electrically isolated input channels each providing a first narrowed area for restricting an emitting direction of the carrier,
   electrodes for applying an electrostatic potential for changing a traveling direction of the carrier emitted from the input channels,
   a single second narrowed area positioned opposed to the exits of the plural input channels for passing through only the carriers traveling in the restricted emitting direction,
   an acceptor electrode for collecting the carriers which have passed through the single second narrowed area, and
   a threshold circuit for applying a potential difference generated at a resistor lying between said acceptor electrode and a ground electrode of said synapse circuit as a control voltage for a gate of a transistor.

3. A semiconductor synapse circuit comprising:
   a plurality of emitters for generating carriers;
   each emitter having a structure for guiding carriers to travel in a predetermined direction to pass through an aperture;
   a plurality of gate electrodes, each disposed at an opposite side of a respective aperture from a respective emitter, for changing a direction of travel of carriers passing through said respective aperture;
   a point contact for passing carriers within a predetermined range thereof; and
   an acceptor electrode collecting carriers passed through said point contact.

4. The semiconductor synapse circuit of claim 3, wherein a distance from said aperture to said point contact is less than about 10 micrometers.

5. The semiconductor synapse circuit of claim 4, wherein said distance is 5 micrometers.

6. The semiconductor synapse circuit of claim 3, further comprising:
   a threshold transistor which controls an output current of said synapse circuit based on carriers collected by said acceptor electrode.

7. The semiconductor synapse circuit of claim 3, further comprising:
   threshold means for controlling an output of said synapse circuit based on carriers collected by said acceptor electrode.

* * * * *